United States Patent [19]

McKenny et al.

[11] 4,251,876
[45] Feb. 17, 1981

[54] EXTREMELY LOW CURRENT LOAD DEVICE FOR INTEGRATED CIRCUIT

[75] Inventors: Vernon G. McKenny; Tsiu C. Chan, both of Carrollton, Tex.

[73] Assignee: Mostek Corporation, Carrollton, Tex.

[21] Appl. No.: 957,587

[22] Filed: Nov. 3, 1978

Related U.S. Application Data

[63] Continuation of Ser. No. 743,810, Nov. 22, 1976, abandoned.

[51] Int. Cl.³ .............................................. G11C 11/40
[52] U.S. Cl. ..................... 365/182; 307/238; 357/45
[58] Field of Search ............... 365/174, 178, 181, 182; 307/238; 357/20, 45, 46

[56] References Cited

U.S. PATENT DOCUMENTS

| | | | |
|---|---|---|---|
| 3,560,764 | 2/1971 | McDowell | 365/189 |
| 3,986,173 | 10/1976 | Baitinaer et al. | 365/189 |
| 4,001,762 | 1/1977 | Aoki et al. | 357/59 |

*Primary Examiner*—Terrell W. Fears

[57] ABSTRACT

A MOSFET random access memory having an extremely low current load memory cell is disclosed. The memory cell comprises a cross-coupled binary stage in which one or more paths to ground can be selectively switched on or off through true and complement data nodes. Impedance means connect a power supply node to the data nodes for charging the data nodes to predetermined voltage levels. The impedance means comprise an intrinsic-extrinsic junction of a substantially pure, intrinsic semiconductor material and a diffusion of extrinsic conductivity impurities disposed within a region of the intrinsic semiconductor material. The impedance means is formed by an isoplanar silicon gate process as an integral portion of a polycrystalline silicon strip which interconnects the power supply node to a data node. A portion of the polycrystalline silicon strip is extended from the data node to form the gate of the transistor to which it is cross-coupled.

17 Claims, 14 Drawing Figures

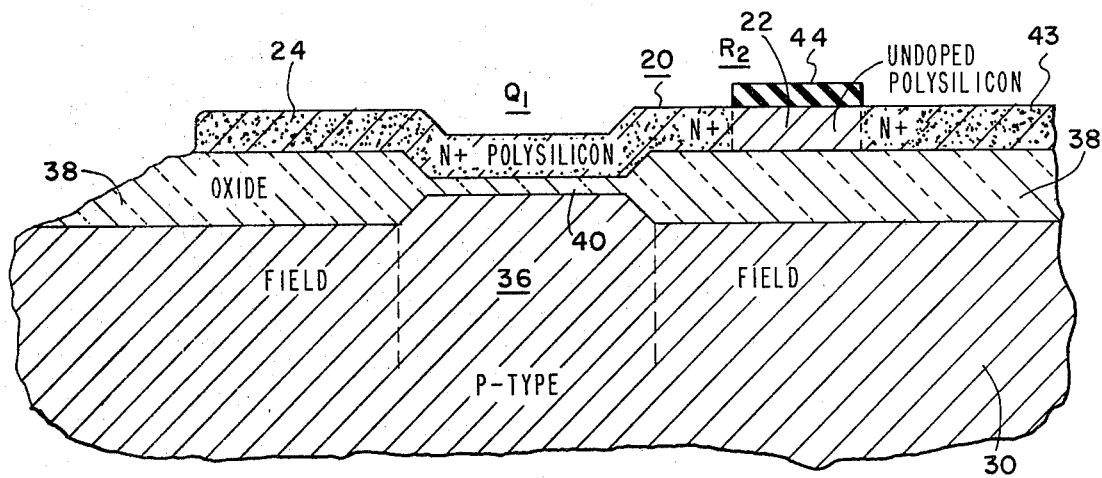
FIG. 4
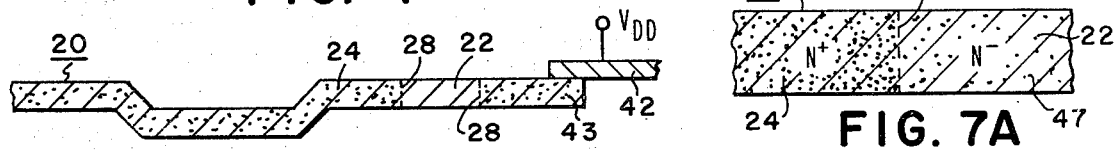
FIG. 5
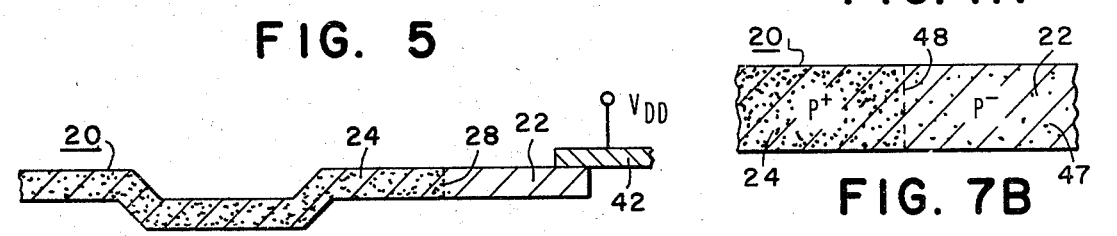
FIG. 6
FIG. 7A
FIG. 7B
FIG. 8A
FIG. 8B
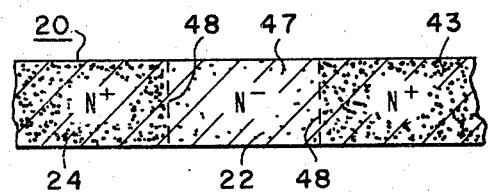
FIG. 9A
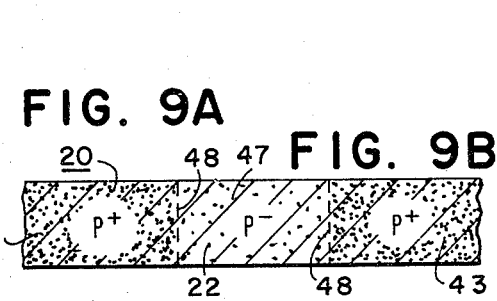
FIG. 9B
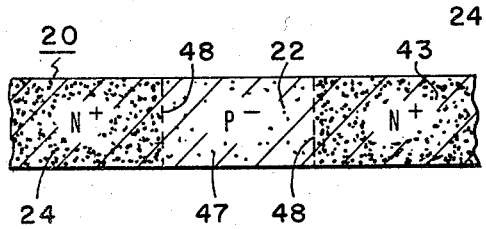
FIG. 10A
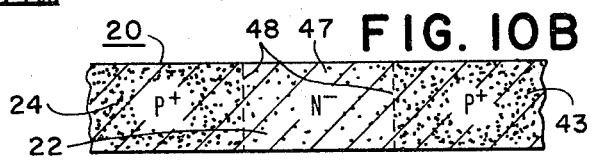
FIG. 10B

EXTREMELY LOW CURRENT LOAD DEVICE FOR INTEGRATED CIRCUIT

This is a continuation of application Ser. No. 743,810, filed Nov. 22, 1976 now abandoned.

BACKGROUND OF THE INVENTION

1. Field of the Invention

The present invention is concerned with random access memories of the type fabricated on a monolithic semiconductor chip using insulated gate semiconductor field effect transistor technology, and more particularly relates to an impedance device for conducting extremely low currents from a drain supply node through the channel of an insulated gate field effect transistor in a memory cell.

2. Description of the Prior Art

A digital memory must contain a discrete physical storage cell which is capable of being set by an external signal into one of two distinct states for each bit of the computer word to be stored. The cell must remain in this set state indefinitely or until it is changed to the other state by another external signal. The two distinct states of a storage cell can be naturally occurring states which require no external energy source to be maintained. It is also possible to use storage elements of the volatile type which require external energization to maintain the stored state. A well-known example of such storage elements is the bistable circuit which employs semiconductor devices. These devices require a continual or permanent application of power in order to prevent deterioration or a complete loss of the stored information.

Large scale integration (LSI) techniques have brought about the construction of large arrays of such storage elements on a single chip of silicon. These storage cells, typically using MOS technology, consist of multicomponent circuits in a conventional bistable configuration. Storage of this type is inherently volatile since the semiconductor bistable elements require a constant source of power to maintain the stored information. In some applications, it is essential that the data should not be irretrievably lost due to an interruption of power. In those applications, standby power is provided by means of batteries which are operably connected to power supply nodes of the memory system to supply power in the event of an inadvertent interruption of essential d.c. power, and to supply power during operation of the memory in the standby mode.

The immediate advantages of semiconductor storage devices are the high packing density and low power requirements. The insulated gate MOS transistor has been particularly exploited in this application area since it requires less substrate area (thereby increasing the packing density) and operates at very low power levels. A well known memory cell circuit arrangement which utilizes insulated gate MOS field effect transistors is the cross-coupled inverter stage as disclosed in U.S. Pat. No. 3,967,252. In that circuit the gates of a pair of MOSFET transistors are cross coupled to a true data node and a complementary data node. Information stored within the cell is maintained by impedance means which are connected to the data nodes to maintain the potential at the gate of the transistors at a predetermined level which corresponds to the logic content of the cell. Each inverter of the cell consists of a driver transistor and a load impedance means. In the circuit shown in that reference, the load impedance means comprises a MOSFET transistor. In earlier circuits, impedance means comprising diffused resistors typically exhibiting 10 to 20 ohms per square were utilized. However, use of the MOSFET transistor has been preferred since it is capable of providing 20,000 ohms per square, giving practical resistance values of the order of 100,000 to 200,000 ohms.

By using less surface area than a conventional diffused resistor, MOS technology allows more complex circuitry on a single monolithic chip than would otherwise be possible. For low current load device applications, the depletion MOSFET transistor having its gate tied to its source occupies less substrate area. However, for very low current load applications, the depletion transistor with gate tied to source occupies several square mils of area in the microampere load range.

In the static random access memory cells shown in U.S. Pat. No. 3,967,252, there are two cross-coupled inverters and two transfer resistors, i.e., two load devices and four transistors. In a 1K static RAM, the 1,024 memory cells take up approximately 40 percent of the total chip area, while in the 4K static RAM the 4,096 memory cells occupy slightly more percentage of the chip. In order to keep the chip area as small as possible and the power consumption as low as possible, the two load devices in the static cell of each inverter should be relatively small in area and provide extremely low current. One drawback to the use of the depletion transistor for the load device is that its body effect due to back gate bias generally increases as the physical size of the active area is reduced. A further drawback to the use of the MOS device as the load resistor is that the resistance exhibited by the device is inherently limited by its body effect associated with the source-to-substrate reverse-bias voltage. Although this arrangement will provide practical resistance values on the order of 100,000 to 200,000 ohms, in some extremely low power consumption applications it is desirable to provide load devices exhibiting a resistance in the one megohm to 100 megohm range.

SUMMARY OF THE INVENTION

It is an object of the present invention to provide an extremely low current load device which exhibits a resistance which greatly exceeds that provided by conventional MOS load devices, which occupies relatively less surface area of the substrate, and which is not adversely affected by reverse bias conditions.

According to one aspect of the present disclosure, the invention may be practiced in combination with a binary memory cell which includes true and complementary data input/output nodes which provide d.c. current impedance paths corresponding to each binary logic state. The memory cell further includes first and second insulated gate field effect transistors having channels which electrically connect the data nodes to a source power supply node. The gates of the transistors are electrically cross-coupled to the data nodes. The data nodes are charged to a reference potential which corresponds to each binary logic state by means of first and second impedance devices which electrically connect a drain power supply node to the first and second data nodes respectively. Each of the impedance means is a semiconductor structure comprising an intrinsic-extrinsic junction of a substantially pure, intrinsic semiconductor material and a diffusion of extrinsic impurities disposed within a region of the intrinsic semiconductor material. The intrinsic semiconductor material is of the same elemental semiconductor type as is the substrate but the magnitude of its conductivity is substantially less than the conductivity of the extrinsic semiconductor material. The extrinsic semiconductor material may be either N-type or P-type.

For typical $V_{DD}$ values (e.g., 5 V DC), the total leakage current of either of the cross-coupled transistors is in the pico-ampere range while the current conducted by the intrinsic-extrinsic junction impedance device is in the nano-ampere range. Consequently the low current load impedance device can supply more than enough current to overcome leakage in the P-N junctions in the memory cell transistors, thereby maintaining the gate bias and preserving the logic content of the cell. The temperature coefficient of the impedance device is characterized by the same polarity as that of the memory cell junctions, so that the output of the low current load device will "track" thermal variations in the leakage current of the memory cell transistors. Thus the current consumed by the memory cell can be designed for a minimum value within a given operating temperature range. It should be noted that minimum current cannot be designed with a conventional high-ohmic diffusion resistor in the same temperature range since the leakage current at the drain of the memory cell transistor increases with temperature while current through the conventional diffusion resistor decreases.

According to a method disclosed herein, the extremely low current load device is constructed by depositing a layer of substantially intrinsic semiconductor material over the surface of an insulating layer to provide a conductive interconnect between a drain diffusion node of an insulated gate transistor and a drain power supply node. An intrinsic-extrinsic junction is formed at a selected point intermediate the drain diffusion node and the power supply node by diffusing impurities through a mask formed on a selected surface site of the intrinsic interconnect layer until the intrinsic material underlying the area exposed by the mask is transformed to an extrinsic conductivity type.

In a preferred embodiment, each impedance means is formed during an isoplanar silicon gate process as an integral part of a polycrystalline silicon strip which interconnects the drain power supply node to a selected one of the data nodes. A portion of the polycrystalline silicon strip is extended from the selected data node to form the gate to which it is cross-coupled.

The direct current impedance presented by the intrinsic-extrinsic junction of silicon, when reverse biased, approaches 1,000 megohms. The impedance may be reduced by diffusing a relatively light dose of impurities through the intrinsic semiconductor region until the region is transformed into a lightly doped extrinsic region. According to this method, the intrinsic-extrinsic junction is transformed into an extrinsic-extrinsic junction which is characterized by a heavy concentration of impurities disposed in junction forming relation with a relatively light concentration of impurities, both impurity concentrations being of the same conductivity type, or being of opposite conductivity.

The novel features believed characteristic of this invention are set forth in the appended claims. The invention itself, however, as well as other objects and advantages thereof, may best be understood by reference to the following detailed description of illustrated embodiments, read in conjunction with the accompanying drawing:

BRIEF DESCRIPTION OF THE DRAWING

FIG. 4 is an elevation view, in section, taken along the line IV—IV of FIG. 3;

FIG. 5 is a sectional view of a preferred embodiment of a gate interconnect which includes a load impedance device constructed according to the teachings of the present invention;

FIG. 6 is a sectional view of a gate interconnect portion including an alternate embodiment of a load impedance device;

FIGS. 7A, 7B, 8A, 8B, 9A, 9B, 10A and 10B are sectional views of alternate embodiments of impedance load devices constructed according to the teachings of the present invention.

DETAILED DESCRIPTION OF THE INVENTION

In the description which follows, the present invention is described in combination with a random access memory of the type fabricated on a single monolithic semiconductor chip using insulated gate field effect transistor technology. The structure as disclosed herein may be fabricated on a single semiconductor chip and is primarily intended for such fabrication.

Figure 1:
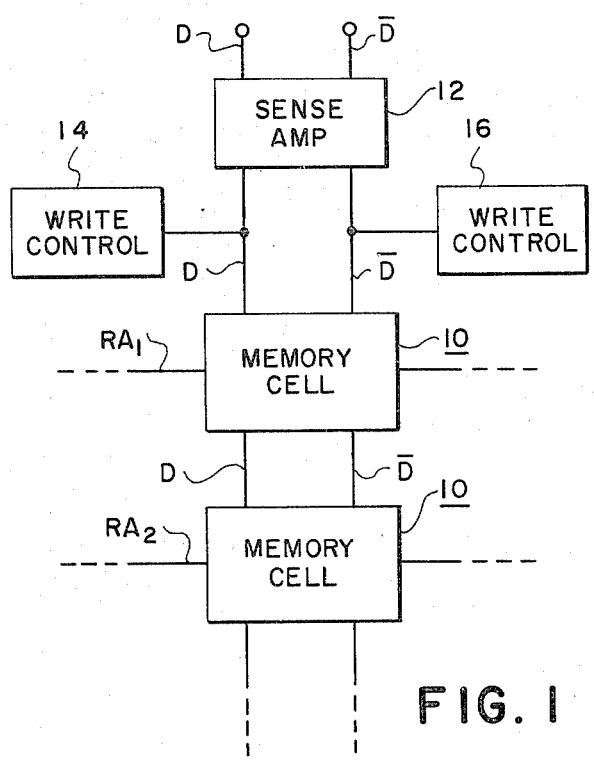
FIG. 1 is a block circuit diagram of a portion of a random access memory which utilizes a memory cell constructed according to the teachings of the present invention.
Figure 2:
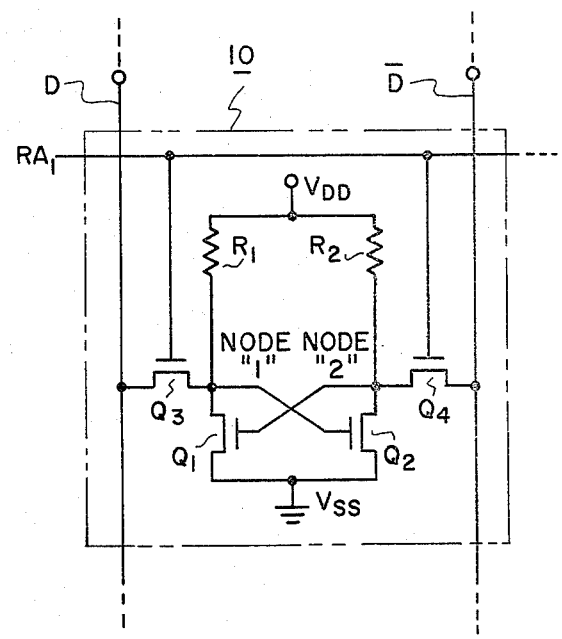
FIG. 2 is an electrical circuit diagram of the memory cell shown in FIG. 1.

Referring now to FIG. 1 and FIG. 2 of the drawing, a portion of a random access memory which utilizes circuitry constructed according to the teachings of the present invention is illustrated. In FIG. 1, a portion of a random access memory includes a plurality of static memory cells 10 which are part of an array of many such cells arranged in rows and columns in the conventional manner. The memory cells 10 are disposed in the same column and accordingly are connected to complementary data buses D, $\overline{D}$. Since the memory cells 10 are disposed in separate rows, the cells are addressed or enabled by separate row lines $RA_1$ and $RA_2$, respectively. The row address line $RA_1$ enables all of the memory cells in one row while address line $RA_2$ enables all the memory cells in a second row.

A sense amplifier and level shifter is indicated generally by the reference numeral 12 and is connected to the column buses D and $\overline{D}$. The sense amp 12 may be of any conventional type, for example, that which is disclosed and claimed by U.S. Pat. No. 3,967,252. Write control circuits 14 and 16 are connected to drive the column buses D and $\overline{D}$, respectively, during a write cycle in the conventional manner. Column enable means (not illustrated) may be provided to connect different pairs of column buses to a single sense amp, or a separate sense amp may be provided for each pair of column buses.

An electrical schematic diagram of the memory cell 10 is illustrated in FIG. 2 of the drawing. The binary memory cell 10 comprises first and second complementary data input-output nodes 1 and 2 which provide a direct current impedance path and a relatively higher direct current impedance path corresponding to each binary logic state. First and second impedance means, $R_1$ and $R_2$, electrically connect a drain supply node $V_{DD}$ to the first and second data nodes 1, 2 respectively.

The structure of the impedance means $R_1$ and $R_2$ will be described in detail hereinafter. The memory cell 10 also includes a pair of cross coupled insulated gate field effect transistors $Q_1$ and $Q_2$. The data nodes 1, 2 are cross-coupled by the gates of the transistors $Q_1$ and $Q_2$, respectively, and are connected by enabling transistors $Q_3$ and $Q_4$ to the column buses D and $\overline{D}$, respectively. The gates of the enabling transistors $Q_3$ and $Q_4$ are connected to the corresponding row address line $RA_1$. The channel between the drain and source terminals of transistors $Q_1$ and $Q_2$ electrically connect each data node 1, 2 to a source power supply node $V_{SS}$ when conducting.

To understand the operation of the circuit of FIG. 2, assume that the row address line $RA_1$ is low (logic "0") so that the enabling transistors $Q_3$ and $Q_4$ of memory cell 10 which are connected to the row address line $RA_1$ are turned off. This allows the column buses D and $\overline{D}$ to assume a voltage level of $V_{DD}$ less one threshold in this implementation because there are no current paths to the source voltage $V_{SS}$. In a typical circuit, $V_{DD}$ may be five volts and the threshold may be about 2.5 volts, in which case the column buses D and $\overline{D}$ would be about 2.5 volts. In other implementations, D and $\overline{D}$ may assume voltage levels as high as $V_{DD}$ or as low as or slightly more than one threshold above $V_{SS}$. In this state, no current will flow through the column buses D and $\overline{D}$ because each is an open circuit in the absence of a current path through an enabled cell. As a result the data output nodes 1, 2 are at a voltage substantially equal to $V_{DD}$ or $V_{SS}$, respectively, from the nodes 1, 2 to $V_{SS}$.

Assume that a logic "0" has been stored in the memory cell 10 so that the transistor $Q_1$ is turned on and data node 1 is substantially at $V_{SS}$, and that transistor $Q_2$ is turned off and the data node 2 is substantially at $V_{DD}$. Then when the row address line $RA_1$ goes high, that is, is charged to a bias potential corresponding to a logic "1", the memory cell 10 is enabled as the transistors $Q_3$, $Q_4$ turn on. This results in a current path to $V_{SS}$ through the transistor $Q_1$ and $Q_3$ and the column bus D. The transistor $Q_2$ is turned off so that no current path is established from the column bus $\overline{D}$ to ground. As a result, the data node 2 remains substantially at $V_{DD}$, or five volts. If, on the other hand, a logic "1" is stored in the address memory cell 10, the transistor $Q_1$ is turned off and transistor $Q_2$ is turned on. Current through $Q_2$ and $Q_4$ then causes the bus $\overline{D}$ to decrease from about 5 volts to a lower level while the voltage of the column bus D and data node 1 remain at the precharge level of 5 volts.

It will be noted that the data output nodes 1, 2 swing between $V_{DD}$ and $V_{SS}$ depending upon the logic content of the cell. These voltage levels must be maintained to preserve the logic content of the cell 10. In the memory cell 10, these reference potentials are maintained at the data nodes 1, 2 by the load impedance devices $R_1$ and $R_2$ which connect the nodes to the drain supply node $V_{DD}$.

Figure 3:
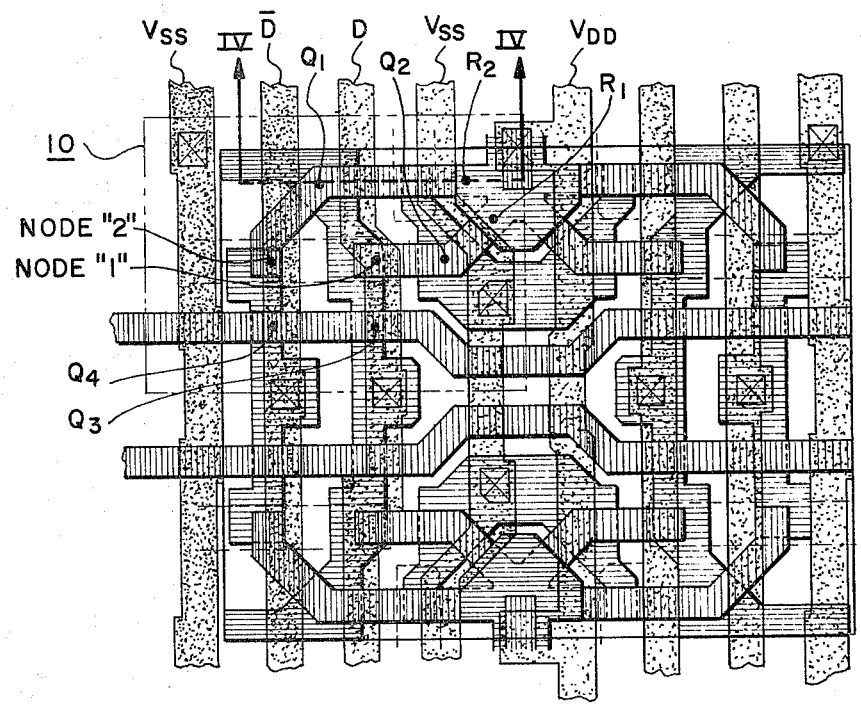
FIG. 3 is a substrate layout diagram of the circuit shown in FIG. 2.

Referring now to FIGS. 3 and 4 of the drawing, a substrate layout of the memory cell 10 is illustrated. According to the teachings of the present invention, each of the load impedance devices $R_1$ and $R_2$ include a body 20 of substantially pure intrinsic semiconductor material defining a first conductive path 22 and a diffusion of extrinsic conductivity impurities disposed within a region of the intrinsic body 20 defining a second conductive path 24. An intrinsic-extrinsic junction 28 is defined by the interface of the extrinsic diffusion path 24 and the undoped intrinsic path 22. The intrinsic path 22 and the extrinsic path 24 define a series electrical path from the drain supply node $V_{DD}$ to the corresponding data node 1, 2. As used herein, the phrase "intrinsic semiconductor material" means elemental semiconductor material which is undoped and which has not been diffused or implanted with impurities.

The memory cell 10 is disposed upon a substrate 30 of an extrinsic semiconductor material of a first conductivity type, for example P-type monocrystalline silicon. Each of the field effect transistors $Q_1$–$Q_4$ include a source region (not shown) and a drain region (not shown) material of the opposite conductivity type, for example N-type, extending substantially parallel to each other in the conventional manner in an active region 36 of the substrate 30. A layer 38 of insulation is disposed over the surface of the substrate 30 and is formed relatively thin in the gate zone 40 which lies directly over the active region 36. The conductive path 24 serves as a gate interconnect portion for the transistor formed over the active region.

The semiconductor material which forms the conductive layer 20 is of the same elemental semiconductor type as is the substrate 30, and is preferably constructed as a continuous layer of polycrystalline silicon. The extrinsic impurities diffused within the layer 20 may be either N-type or P-type. In a preferred embodiment, the extrinsic impurities diffused into the layer 20 are of the opposite conductivity type relative to the conductivity type of the substrate 30. For example, for a P-type substrate 30, the impurities diffused into the layer 20 are N-type, so that the gate strip 24, source and drain regions, and impedance devices $R_1$, $R_2$ may all be formed during a single diffusion step of an isoplanar silicon gate process.

Referring now to FIGS. 5 and 6, the drain supply node $V_{DD}$ may comprise a metallization deposit 42 which is bonded directly to a diffused gate interconnect portion 43 as shown in FIG. 5, or in some instances the metallization deposit 42 may be bonded directly to the substantially pure intrinsic region 22 as shown in FIG. 6 of the drawing. In either of the configurations shown in FIGS. 5 and 6, the substrate surface area utilized for the impedance load device $R_2$ is extremely small with the width of the gate interconnect portion 24 being typically 5 microns and the length of the intrinsic undoped conductive path 22 being typically 8 microns. An intrinsic-extrinsic junction device constructed with these dimensions may exhibit as much as 1,000 megohms impedance to the flow of direct current. The impedance may be reduced by diffusing a relatively light dose 47 of impurities through the intrinsic conductive path 22 until that region is transformed into a very lightly doped extrinsic conductivity region. Examples of mixed extrinsic-extrinsic junction devices characterized by a heavy concentration of impurities disposed in junction forming relation with a relatively light concentration of impurities, both impurity concentrations being of the same conductivity type, or being of opposite conductivity, is illustrated in FIGS. 7A, 7B, 8A, 8B, 9A, 9B, 10A and 10B.

Referring again to FIGS. 3 and 4, the substrate 30 is the starting material for the process of the present invention. The semiconductor substrate 30 is typically silicon and may have either N-type or P-type conductivity. However, the semiconductor substrate 30 may be any conventional type used in the fabrication of insulated gate semiconductor field effect devices; the crystal orientation and doping levels being conventional and well known.

In the discussion which follows, a process is described which utilizes a substrate chip of monocrystalline silicon which has been doped with P-type impurities and into which opposite conductivity impurities are diffused to construct an N-channel insulated gate transistor in an isoplanar silicon gate diffusion process. The semiconductor substrate 30 is placed in a conventional oxidizing furnace and the oxide layer 38 is thermally grown on the surface of the substrate 30 to a typical thickness of 600 angstroms. Thereafter a layer of nitrite is deposited over the oxide layer in a thickness of approximately 600 angstroms. A photoresist mask is formed over the combined nitride and oxide layers and is patterned using conventional photolithographic techniques to provide a mask to define the active area 36 and the surrounding field areas. The layer of nitride is removed from the field areas and ion impurities of the same conductivity type as the doping of the substrate are implanted therein. The ions may be derived from boron compounds, such as $BF_3$ for P-type substrates, or from phosphorous compounds, such as $PH_4$ to produce N-type substrates. Equipment for such ion implantation is commercially available and its use for implantation purposes is well known in the industry. This ion implantation step is performed in the field area surrounding the active area 36 to reduce cross talk between adjacent transistors in the same substrate.

Next the photoresist mask is removed from the active area and a layer of thermal oxide is grown over the field area to a thickness of approximately 8,000 angstroms. Thereafter the nitride and oxide layers are removed from the active area, and a layer 40 of gate oxide is grown over the active area 36 to a thickness of approximately 900 angstroms.

Next a layer 20 of undoped polycrystalline silicon semiconductor material is deposited over the gate oxide. The polycrystalline silicon layer 20 may be formed by any suitable conventional process, such as by the decomposition of $SiH_4$ (silane) in a cold wall epitaxial reactor or in a hot wall furnace. The polycrystalline silicon layer 20 is typically from 3,000 angstroms to 6,000 angstroms in thickness.

The undoped polycrystalline silicon layer 20 is masked and photoresisted to define a gate strip 24. A diffusion-impervious layer of nitride or oxide is deposited over the undoped gate interconnect portion which is masked and photoresisted to define the mask 44 over the situs 22 of the low current load impedance device, for example $R_1$ or $R_2$.

The layer of undoped polycrystalline silicon 20 and the active area 36 is then exposed to diffusion impurities of the opposite conductivity type whereby a diffused gate 24 and diffused source and drain regions (not shown) are formed within the active region 36 by the diffusion of impurities into the gate strip 24 and into the active area 36 of the substrate on either side of the gate strip. A nondiffused channel region is defined in the active area beneath the gate strip by the masking action of the gate 24 strip as it receives the diffusion of impurities. The intrinsic-extrinsic junction 28 is formed in the layer 20 at the interface of the undoped semiconductor material 22 lying beneath the mask 44 and adjacent to the impurity diffusion.

Thereafter, an insulating oxide layer is formed to a thickness of approximately 10,000 angstroms over the chip area and is masked and photoresisted to define the location of conductive interconnects. Metallization deposits are formed at the appropriate conductive interconnect locations.

The gate interconnect 20 may be electrically connected to the common power supply node by electrically connecting the undoped portion 22 of the intrinsic-extrinsic junction of the load impedance device directly to the power supply node 42. In an alternate embodiment of the impedance devices $R_1$, $R_2$ wherein first and second diffused extrinsic regions 24, 43 are formed by diffusing the interconnect portion on both sides of an intermediate interior undoped region 22, the electrical union of the gate interconnect portion 20 with the common power supply node 42 is performed by electrically connecting the diffused extrinsic region 43 directly to the power supply node 42 and electrically connecting the diffused extrinsic region 24 to the drain node of the transistor.

The impurity diffusion step may be carried out by conventional techniques, for example, by exposing the surface of the substrate at temperatures in the neighborhood of 1,100° centigrade to a gas containing the required impurities, for example boron for P-channel devices or phosphorous for N-channel devices.

The mask 44 may be formed from silicon nitride which is an effective mask against diffusion of impurities such as boron and phosphorous. Silicon nitride is pyrolytically deposited by reacting silane and ammonia with excess hydrogen over the interconnect 20 at temperatures in the range of 400° to 1,100° centigrade. After the diffusion step, a 10,000 angstrom oxide layer is deposited over the chip area which is further masked with photoresist applied to define the $V_{DD}$ metallization contact node 42 which is illustrated in FIGS. 5 and 6 of the drawing.

The gate interconnect portions 24, 43 of each of the transistors $Q_1$ and $Q_2$ are bonded to the drain power supply node 42 and the data node 1 is connected to the drain region of $Q_1$ by means of conductive interconnects (not shown) to form an integrated circuit. Data node 1 is formed by forming a conductive interconnect between the drain region of $Q_1$ and the gate interconnect portion 24 of $Q_2$. Similarly, data node 2 is formed by forming a conductive interconnect between the drain region of $Q_2$ to the corresponding gate interconnect portion of $Q_1$.

The direct current impedance exhibited by the extremely low current load devices $R_1$, $R_2$ may be reduced somewhat by diffusing a relatively light dose of extrinsic impurities through the undoped regions 22 of the devices until the material is transformed into a lightly doped extrinsic region. The intrinsic-extrinsic junction 28 is transformed into an extrinsic-extrinsic junction 48 which is characterized by a heavy concentration of impurities disposed in junction forming relation with a relatively light concentration of impurities, both impurity concentrations being of the same conductivity type, or being of the opposite conductivity type. It is essential, however, that the impurity concentration levels be substantially differentiated with respect to each other in order to achieve very high direct current impedances.

The ion implanting steps described herein may be carried out by conventional ion implanation techniques, for example as disclosed and claimed in U.S. Pat. No. 3,898,105, which patent is hereby incorporated by reference.

In the operating range of 5 volts and 2.5 volts at the data nodes 1 and 2 corresponding to either a logic "1" or logic "0", and in consideration of a design load factor of 40 milliwatts in standby mode, for a 4K bit (4,096 bits) memory, each bit consumes 0.01 milliwatts of power. At 5 volts, no more than 2 microamps per load device must be provided by the impedance load device $R_1$, $R_2$. This establishes a value of 2.5 megohms as the lower limit of the range of the impedance of the low load devices $R_1$ and $R_2$. The upper limit of the impedance range corresponding to the expected maximum leakage of the transistors $Q_1$ and $Q_2$ is found by dividing 2.5 volts by 10 nanoamps (which is the maximum leakage expected for $Q_1$ and $Q_2$) which yields 250 megohms. By careful control of the purity of the undoped polysilicon region 22 and the N-type extrinsic doping of the polysilicon layer 20, the resistance of $R_1$ and $R_2$ can be controlled within the range from 2.5 to 250 megohms to provide a memory cell which consumes a minimum amount of current through a given temperature range subject to the maximum value allowable for power considerations and the maximum leakage current expected at elevated operating temperatures.

Although preferred embodiments of the invention have been described in detail, it is to be understood that the invention is not limited to the embodiments disclosed, but is capable of numerous modifications and substitution of parts and elements without departing from the spirit of the invention.

What is claimed is:

1. In an integrated circuit memory having a drain supply node and a source supply node, a binary memory cell comprising:

first and second complementary data input-output nodes, each of the nodes providing one d.c. current impedance path and one higher d.c. current impedance path corresponding to each binary logic state, respectively;

first and second insulated gate field effect transistors the channels of which electrically connect the first and second data nodes, respectively, to the source supply node, the gate of the first transistor being electrically coupled to the second data node, and the gate of the second transistor being electrically coupled to the first data node; and, first and second impedance means electrically connecting the drain supply node to the first and second data nodes, respectively, each impedance means including a body of substantially intrinsic semiconductor material defining a conductive path and a doping of extrinsic conductivity impurities disposed within at least one defined region of the intrinsic body, at least one intrinsic-extrinsic junction being defined by the interface of the doped extrinsic region within the intrinsic body, and forming a series electrical path from the drain supply node to the corresponding data node.

2. The combination as claimed in claim 1 wherein the drain supply node, when charged, is characterized by a positive electrical potential with respect to the potential of the source supply node, the doping of extrinsic impurities being of the N-conductivity type and the intrinsic semiconductor material being of the P-conductivity type.

3. The combination as defined in claim 2 including a doping of P-conductivity impurities disposed throughout the intrinsic body, the magnitude of the P-conductivity impurity concentration being small as compared with the magnitude of the N-conductivity impurity concentration.

4. The combination as defined in claim 1 wherein the drain supply node, when charged, is characterized by a negative electrical potential with respect to the potential of the source supply node, the doping of the extrinsic impurities being of the P-conductivity type and the intrinsic semiconductor material being of the N-conductivity type.

5. The combination as defined in claim 4 including a doping of N-conductivity impurities disposed throughout the intrinsic body, the magnitude of the N-conductivity impurity concentration being small as compared with the magnitude of the P-conductivity impurity concentration.

6. In an integrated circuit memory having a drain supply node and a source supply node, a binary memory cell comprising:

first and second complementary data input-output nodes, each of the nodes providing one d.c. current impedance path and one higher d.c. current impedance path corresponding to each binary logic state, respectively;

first and second insulated gate field effect transistors the channels of which electrically connect the first and second data nodes, respectively, to the source supply node, the gate of the first transistor being electrically coupled to the second data node, and the gate of the second transistor being electrically coupled to the first data node; and first and second impedance means electrically connecting the drain supply node to the first and second data nodes, respectively, each impedance means including a body of substantially intrinsic semiconductor material defining a conductive path and having extrinsic impurities disposed within two separately defined regions of the intrinsic body, the two extrinsic regions being of the same conductivity type, intrinsic-extrinsic junctions being defined by the interface of the extrinsic regions with the remaining intrinsic body, and defining a series path for the flow of current from the drain supply node to the corresponding data node.

7. The combination as defined in claim 6 wherein the drain supply node, when charged, is characterized by a positive electrical potential with respect to the potential of the source supply node, the doping of extrinsic impurities being of the N-conductivity type and the intrinsic semiconductor material being of the P-conductivity type.

8. The combination as defined in claim 7 including a diffusion of P-conductivity impurities disposed throughout the intrinsic body, the magnitude of the concentration of P-conductivity impurities being small as compared with the magnitude of the concentrations of N-conductivity impurities.

9. The combination as defined in claim 6 wherein the drain supply node, when charged, is characterized by a negative electrical potential with respect to the potential of the source supply node, the doping of extrinsic impurities being of the P-conductivity type and the intrinsic semiconductor material being of the P-conductivity type.

10. The combination as defined in claim 9 including a diffusion of N-conductivity impurities disposed throughout the intrinsic body, the magnitude of the concentration of N-conductivity impurities being small as compared with the magnitude of the concentration of P-conductivity impurities.

11. In combination with an integrated circuit of the type including a substrate of an extrinsic semiconductor material of a first conductivity type and an insulated gate field effect transistor disposed on the substrate, the transistor including source and drain elongated regions of extrinsic semiconductor material of the second conductivity type disposed within the substrate extending substantially parallel to each other and defining a channel region in the substrate therebetween, and an insulated gate disposed over the channel region, an impedance device connected to conduct current from a power supply node through the channel defined by the source and drain regions in response to an electrical potential applied to the insulated gate, the impedance device comprising at least one intrinsic-extrinsic junction of a substantially pure, intrinsic semiconductor material and a doping of extrinsic conductivity impurities disposed within a region of the intrinsic semiconductor material, the impurities being a selected conductivity type, the magnitude of the conductivity of the intrinsic semiconductor material being substantially less than the conductivity of the extrinsic semiconductor material, the conductivity of the extrinsic semiconductor material being either N-type or P-type.

12. The impedance device defined in claim 11 wherein the power supply node, when energized, has a positive polarity providing a positive potential difference for the drain potential with respect to the source potential in response to the flow of current from the power supply node through the channel, the conductivity of the extrinsic semiconductor material comprising the source and drain regions and comprising the extrinsic region of the junction being N-type.

13. The impedance device defined in claim 11 wherein the power supply node, when energized, has a negative polarity providing a negative potential difference for the drain potential with respect to the source potential in response to the flow of current from the power supply node through the channel, the conductivity of the extrinsic semiconductor material comprising the source and drain regions being P-type.

14. The impedance device defined in claim 11 wherein the elemental semiconductor material comprising the substrate and the intrinsic material of the junction is polycrystalline silicon.

15. In an integrated circuit memory having a drain supply node and a source supply node disposed on a semiconductor substrate, a binary memory cell comprising:

first and second insulated gate field effect transistors disposed on the substrate, each transistor having portions defining a source, a drain and a gate, the sources and drains of each transistor being formed by elongated diffused regions within the substrate, the source and drain elongated diffused regions of each transistor extending substantially parallel to each other and defining a continuous channel region in the substrate therebetween;

a layer of insulating material disposed over the channel region of each transistor;

the gate of each transistor being formed by a continuous semiconductor gate strip having a gate defining portion over-lying the insulating material over the associated channel region and a gate interconnect portion;

the source diffusion of each transistor being electrically connected to the source supply node;

the drain diffusion of the first transistor being connected to the gate portion of the second transistor thereby defining a first data node;

the drain diffusion of the second transistor being connected to the gate portion of the first transistor thereby defining a second data node; and, the gate interconnect portions including the first and second impedance means electrically connecting the drain supply node to the corresponding data nodes, each impedance means including a body of substantially intrinsic semiconductor material and a doping of extrinsic conductivity impurities disposed within at least one defined region of the intrinsic body, at least one intrinsic-extrinsic junction being defined by the interface of doped extrinsic region within the intrinsic body, and forming a series electrical path from the drain supply node to the corresponding data node.

16. The integrated circuit memory as defined in claim 15 wherein the semiconductor substrate and the semiconductor gate strip each comprise polycrystalline silicon.

17. In an integrated circuit memory having a drain supply node and a source supply node disposed on a semiconductor substrate, a binary memory cell comprising:

first and second insulated gate field effect transistors disposed on the substrate, each transistor having portions defining a source, a drain and a gate, the sources and drains of each transistor being formed by elongated diffused regions within the substrate, the source and drain elongated diffused regions of each transistor extending substantially parallel to each other and defining a continuous channel region in the substrate therebetween;

a layer of insulating material disposed over the channel region of each transistor;

the gate of each transistor being formed by a continuous semiconductor gate strip having a gate defining portion over-lying the insulating material over the associated channel region and a gate interconnect portion;

the source diffusion of each transistor being electrically connected to the source supply node;

the drain diffusion of the first transistor being connected to the gate portion of the second transistor thereby defining a first data node;

the drain diffusion of the second transistor being connected to the gate portion of the first transistor thereby defining a second data node; and, the gate interconnect portions including the first and second impedance means electrically connecting the drain supply node to the corresponding data nodes, each impedance means including a body of substantially intrinsic semiconductor material having two terminal regions doped with extrinsic impurities of an opposite conductivity to the intrinsic body of series of p-n junctions for the flow of current from the drain supply node to the corresponding data node.

* * * * *